(12) United States Patent
Shao et al.

(10) Patent No.: US 9,418,935 B1
(45) Date of Patent: Aug. 16, 2016

(54) INTEGRATED CIRCUIT LINE ENDS FORMED USING ADDITIVE PROCESSING

(71) Applicant: GLOBALFOUNDRIES INC., Grand Cayman (KY)

(72) Inventors: Dongbing Shao, Wappingers Falls, NY (US); Lei L. Zhuang, White Plains, NY (US); Lars W. Liebmann, Poughquag, NY (US); Lawrence A. Clevenger, LaGrangeville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/848,558

(22) Filed: Sep. 9, 2015

(51) Int. Cl.
| | | |
|---|---|---|
| *H01L 23/52* | (2006.01) | |
| *H01L 23/528* | (2006.01) | |
| *H01L 23/522* | (2006.01) | |
| *H01L 21/768* | (2006.01) | |

(52) U.S. Cl.
CPC ........ *H01L 23/528* (2013.01); *H01L 21/76816* (2013.01); *H01L 21/76877* (2013.01); *H01L 23/5226* (2013.01)

(58) Field of Classification Search
CPC .............. H01L 23/528; H01L 23/5226; H01L 21/76877; H01L 21/76816
See application file for complete search history.

(56) References Cited

U.S. PATENT DOCUMENTS

| | | |
|---|---|---|
| 6,311,319 B1 | 10/2001 | Tu et al. |
| 6,492,073 B1 | 12/2002 | Lin et al. |
| 7,180,187 B2 * | 2/2007 | Fitzsimmons .... H01L 21/76805 257/750 |
| 8,741,552 B2 | 6/2014 | Chen et al. |
| 2014/0272714 A1 | 9/2014 | Chen et al. |
| 2014/0273433 A1 | 9/2014 | Lee et al. |

FOREIGN PATENT DOCUMENTS

EP         1 410 105 B1    2/2012

* cited by examiner

*Primary Examiner* — Roy Potter
*Assistant Examiner* — Paul Patton
(74) *Attorney, Agent, or Firm* — Gibb & Riley, LLC; Yuanmin Cai, Esq.

(57) ABSTRACT

Integrated circuit structures formed using methods herein include a layer, and a material-filled line in the layer. The material-filled line includes a first linear item and a second linear item separated by a separation area of the layer. The first linear item has a first line end where the first linear item contacts the separation area. The second linear item has a second line end where the second linear item contacts the separation area. The first line end and the second line end include line end openings (filled with a material) that increase critical dimension uniformity of the first line end and the second line end.

20 Claims, 7 Drawing Sheets

INTEGRATED CIRCUIT LINE ENDS FORMED USING ADDITIVE PROCESSING

BACKGROUND

The present disclosure relates to forming lines within integrated circuit devices, and more specifically to structures and processes related to the formation of uniform line ends.

Many different devices within integrated circuits are insulated from one another or are electrically connected to one another using linear structures, such as insulating regions or conductive lines. For purposes herein, linear structures are those that have a length dimension that is many times greater than (e.g., 10×, 100×, 1000×) the width dimension, and such structures are generally formed to include one or more sections that extend along a single straight line.

As devices are made smaller and smaller (device scaling) it is useful to have as little excess area surrounding structures, so as to utilize the available real estate of the integrated circuit device to the maximum extent possible. Thus, the dimensions of various devices should be tightly controlled so as to use the available real estate effectively. One concept that is directed toward achieving such an efficient utilization of integrated circuit real estate is critical dimension uniformity (CDU).

With respect to conductive lines, in order to achieve critical dimension uniformity, some processes utilize masks to cut or trim the conductive lines (cutmask for polysilicon conductor; CT for PC); utilize self-aligned double patterning processes (SADP); or utilize other resolution enhanced techniques (or resolution enhanced optical lithography technology; RET). For example, with RET, illuminator parameters or settings can be varied, such as illuminator source shape (e.g., annular source shape, dipole source shape, quadrupole source shape), orientation of the poles, radius, and pole angle. Further, mask or reticle parameters that can be varied with RET include mask type (e.g., binary, phase shift mask (PSM), attenuated PSM) and mask transmission.

SUMMARY

Various methods herein provide a layer having a first linear item and a second linear item. A separation area of the layer is between the first linear item and the second linear item. The first linear item has a first line end where the first linear item contacts the separation area, and the second linear item has a second line end where the second linear item contacts the separation area. Such methods form line end openings at distal portions of the first line end and the second line end to remove the distal portions of the first line end and the second line end, and thereby shorten the first line end and the second line end, and fill the line end openings with a material to increase critical dimension uniformity of the distal portions of the first line end and the second line end.

Various methods herein provide an insulator, pattern a conductive line in the insulator, and remove a section of the conductive line to divide the conductive line into a first linear conductor and a second linear conductor. A separation area of the insulator is between the first linear conductor and the second linear conductor. The first linear conductor has a first line end where the first linear conductor contacts the separation area, and the second linear conductor has a second line end where the second linear conductor contacts the separation area. Such methods form line end openings at distal portions of the first line end and the second line end to remove the distal portions of the first line end and the second line end, and thereby shorten the first line end and the second line end, and fill the line end openings with a conductive material to increase critical dimension uniformity of the distal portions of the first line end and the second line end.

Integrated circuit structures herein include an insulator, and a conductive line in the insulator. The conductive line includes a first linear conductor and a second linear conductor separated by a separation area of the insulator. The first linear conductor has a first line end where the first linear conductor contacts the separation area. The second linear conductor has a second line end where the second linear conductor contacts the separation area. The first line end and the second line end include line end openings filled with a conductive material that increases the critical dimension uniformity of the distal portions of the first line end and the second line end.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, dimensions of various devices should be tightly controlled so as to use the available real estate of integrated circuit structures effectively. Often, linear structures (such as conductive lines) are patterned using optical masks, and the ends of such structures (often referred to as "lineends") can sometimes be irregular, depending upon light scattering, the accuracy of the mask, the position of the device on the wafer, etc. In view of this, some processes utilize additional masking and etching to trim the ends of the conductive lines; however, line end trimming still presents critical dimension uniformity issues.

For example, short bar line ends are more difficult to print and control from a lithographic point of view than are vias (which are simply patterned round holes), which limits design space. Also, even when using a resist island to block trim a single line end (e.g., using SADP, for example) where multiple block shapes allowed, critical dimension control proves very difficult.

In view of this, the methods and structures herein replace the line ends with rounded filled vias. The curved shape of the rounded filled via is highly controllable and much more accurate than mask trimming, thus making all line ends uniform. Further, by utilizing rounded filled vias, the methods and structures herein can make all line ends the same size if desired, and the rounded filled vias potentially can be a smaller size than other conductive vias or other structures formed within the integrated circuit devices, which is ideal for RET and CD control. Thus, the methods and structures herein present less process issues as compared to existing line end cut process, enable more design space, and are ideal for metal wiring and via-metal connections.

Figure 1:
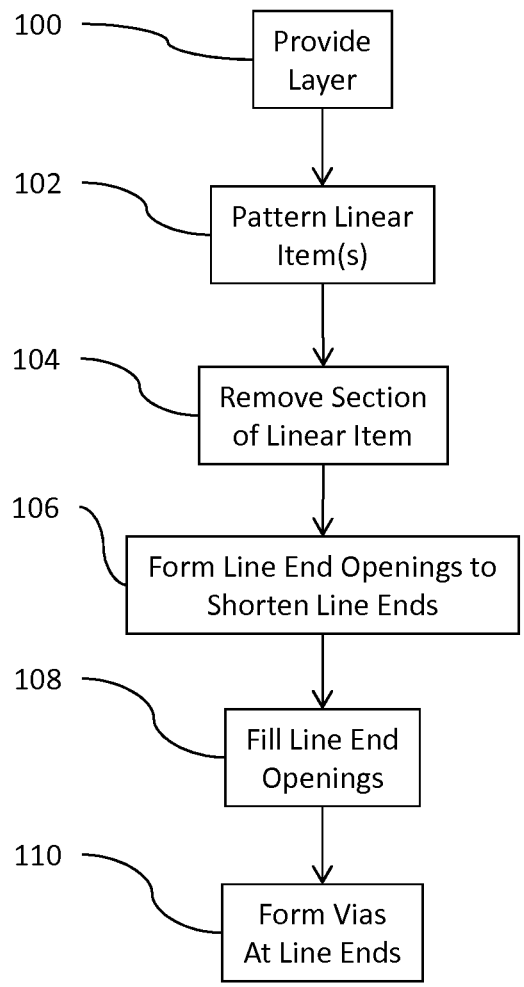
FIG. 1 is a flow diagram illustrating methods herein.

FIG. 1 is a non-limiting flowchart illustrating some of the processes performed by some methods herein. In these exemplary methods, item 100 in FIG. 1 illustrates a process of providing a layer, such as an insulator layer of a multi-layer integrated circuit structure. For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

As shown in item 102, these exemplary methods then pattern a linear item (such as a conductive line) in the insulator layer using, for example, lithographic processes. When patterning any material herein, the material to be patterned can be grown or deposited in any known manner, and a patterning mask layer (such as an organic photoresist) can be formed over the material. The patterning mask layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a positive resist (illuminated portions remain) or negative resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof). A different material can then be deposited, grown, etc., into the openings of the patterned underlying material, or the different material can be formed around and over the patterned underlying material.

Therefore, in this example, in item 102, a linear conductive line can be patterned in an insulator layer of an integrated circuit structure by forming an opening in the insulator layer and depositing a conductor into the openings; or the linear conductive line can be formed by patterning a conductive layer into a conductive line, and then depositing or growing the remainder of the insulator layer around the conductive line.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, nickel, etc., or a metal silicide, any alloys of metals, and may be deposited using physical vapor deposition, chemical vapor deposition, or any other technique known in the art.

The linear item patterned in item 102 maybe a single line, or may be multiple lines separated from one another by a separation area. If the linear item patterned in item 102 is a single line, it can be divided into multiple, separated lines in item 104 of FIG. 1. More specifically, in item 104, these exemplary methods can remove a section of the conductive line (using any of the material removal processes discussed above) to divide the conductive line into a first linear conductor and a second linear conductor. A separation area of the insulator (which can be an air gap) is between the first linear conductor and the second linear conductor. The first linear conductor has a first line end where the first linear conductor contacts the separation area, and the second linear conductor has a second line end where the second linear conductor contacts the separation area.

This removal process (104) can cause the first line end and the second line end to have inconsistent shapes, sizes, and positions. In view of this, in item 106, these exemplary methods form line end openings at distal portions of the first line end and the second line end to remove a distal portion of the first line end and the second line end (using any of the material removal processes discussed above) and thereby shorten the first line end and the second line end. More specifically, the line end openings formed in item 106 can all be the same size (e.g., same diameter) and can all be smaller openings than other via openings that are used for conductive vias. For example, the line end openings can be formed with any known round via opening formation technique, such as immersion, dry etching, e-beam, directed self-assembly (DSA) of block copolymers, etc.

For example, electron beam (e-beam) patterning of the line end openings can be ideal for very small via patterning, and single shot e-beam patterning can be very fast, thereby allowing even more flexible design space. Also, this permits using a wafer staging system, integrated with a scanner system for line printing and an e-beam system for via printing.

In item 108, these methods fill the line end openings. The process in item 108 can fill the line end openings with the same (or similar or different) material used to form the linear items in item 102 (e.g., a conductive material, an insulating material, etc.). Further, the formation (106) and the filling (108) of the line end openings can decrease the surface area of distal ends of the first line end and the second line end (if, for example, the line end openings are filled with a different type of material from the line itself).

The process of forming and filling the line end openings with material can be used sometimes to connect the first line end to the second line end. Also, the removal of the section of the linear item in item 102 can comprise a patterning of a rounded via opening (which trims and rounds the line ends) thereby eliminating the inconsistent shapes of line ends that would be formed by standard mask trimming.

Therefore, the processes in item 104, 106, and 108 essentially replace the original line ends with filled rounded vias. Round via opening formation techniques are more controllable than processes that pattern lines (or line sections) using masks and, therefore, replacing the line ends with filled rounded vias makes the shape and size of all line ends consistent, thereby increasing the critical dimension uniformity of the first line end and the second line end.

Additionally, conductive vias can be formed connected to the first line end and/or the second line end in item 110 at an area immediately adjacent the filled rounded vias through processes of patterning and filling via openings (to form electrical connections to the wire ends). The conductive vias can be, for example, formed in item 110 to have a first diameter that is different relative to the second diameter of the line end openings that are formed in items 104 and 106. Therefore, the filled rounded vias formed from the line end openings have a second diameter that can be smaller (or the same size or bigger) than the first diameter of the conductive vias formed in item 110. Indeed, the conductive vias formed in item 110 may be formed to have many different diameters; while, to the contrary, in some structures herein the filled rounded vias formed from the line end openings can all be the same size. Thus, the first diameter of the conductive vias can include a plurality of diameter values for different ones of the conductive vias; and the second diameter the filled rounded vias formed from the line end openings can include only a single diameter value. In other structures, the filled rounded vias formed from the line end openings can be of different sizes at different line ends.

Figure 2:
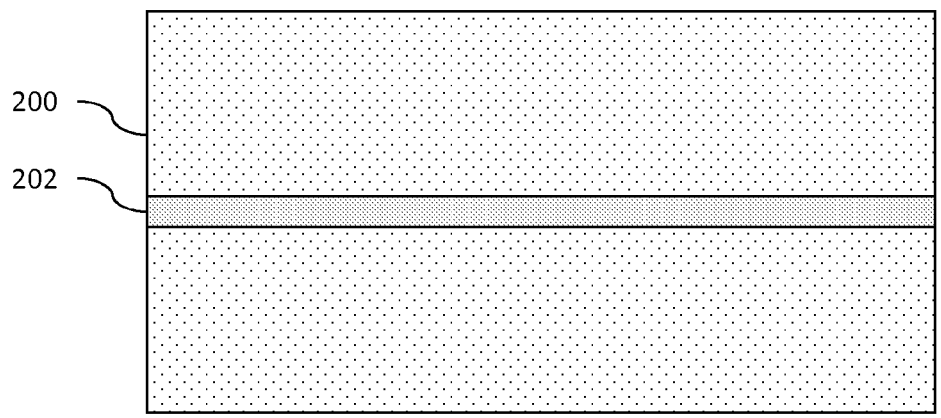
FIG. 2 is a top-view schematic diagram illustrating structures herein.

FIGS. 2-12 are top view diagrams illustrating various stages of manufacturing processes of integrated circuit structures. FIG. 2 illustrates a layer 200, such as an insulator layer 200 of a multi-layer integrated circuit structure. As shown in FIG. 2, these exemplary methods form a linear item 202 (such as a conductive line) in the insulator layer 200. In one example, the linear conductive line 202 can be patterned in the insulator layer 200 of an integrated circuit structure by forming an opening in the insulator layer 200 and depositing a conductor into the openings; or the linear conductive line 202 can be formed by patterning a conductive layer into a conductive line and depositing or growing the remainder of the insulator layer 200 around the conductive line.

Figure 3:
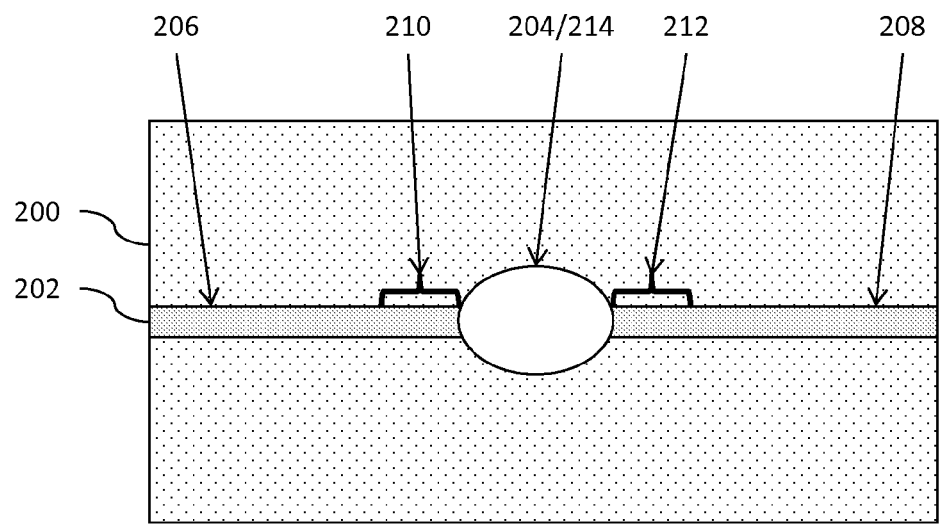
FIG. 3 is a top-view schematic diagram illustrating structures herein.

As shown in FIG. 3, some methods herein form an opening 204 in the linear item 202 (e.g., a rounded via opening) using, for example, the patterning processes discussed above, to define a first linear item 206 (e.g., first linear conductor) and a second linear item 208 (e.g., second linear conductor). This opening 204 also defines a separation area 214 (which may be an air gap) of the insulator 200 that is between the first linear conductor 206 and the second linear conductor 208.

Figure 4:
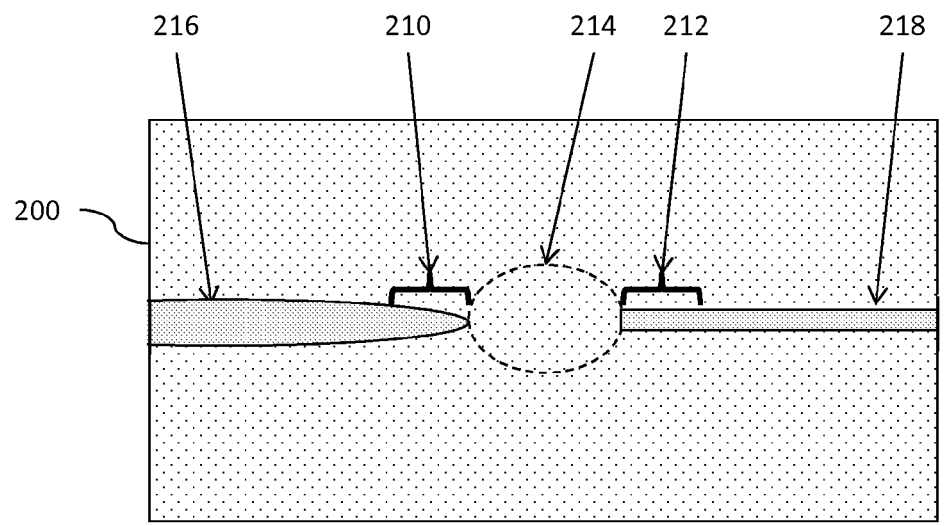
FIG. 4 is a top-view schematic diagram illustrating structures herein.

Thus, as shown above, the linear item may be a single line 202 that is patterned into multiple lines 206, 208 FIG. 3); or as shown in FIG. 4, lithographic processes may be used to pattern multiple lines 216, 218 separated from one another by a separation area 214 of the insulator layer 200. Often, such lithographic processes do not form the multiple lines 216, 218 to have consistent line ends. Instead, such processing can create rounded, tapered line ends that have inconsistent shapes, sizes, and positions (e.g., as shown in FIG. 4, some line ends can have square ends, while others can have rounded ends).

For ease of illustrating the features herein, the first linear conductors 206, 216 are identified as having a first line end 210 (where the first linear conductors 206, 216 contact the separation area 214) and similarly the second linear conductors 208, 218 are identified as having has a second line end 212 (where the second linear conductors contact the separation area 214).

Figure 5:
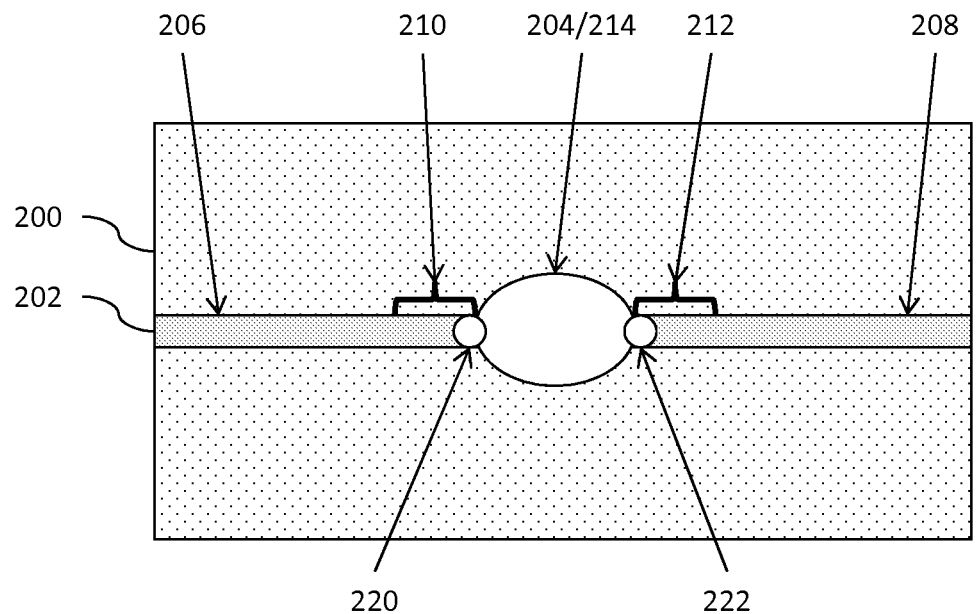
FIG. 5 is a top-view schematic diagram illustrating structures herein.
Figure 6:
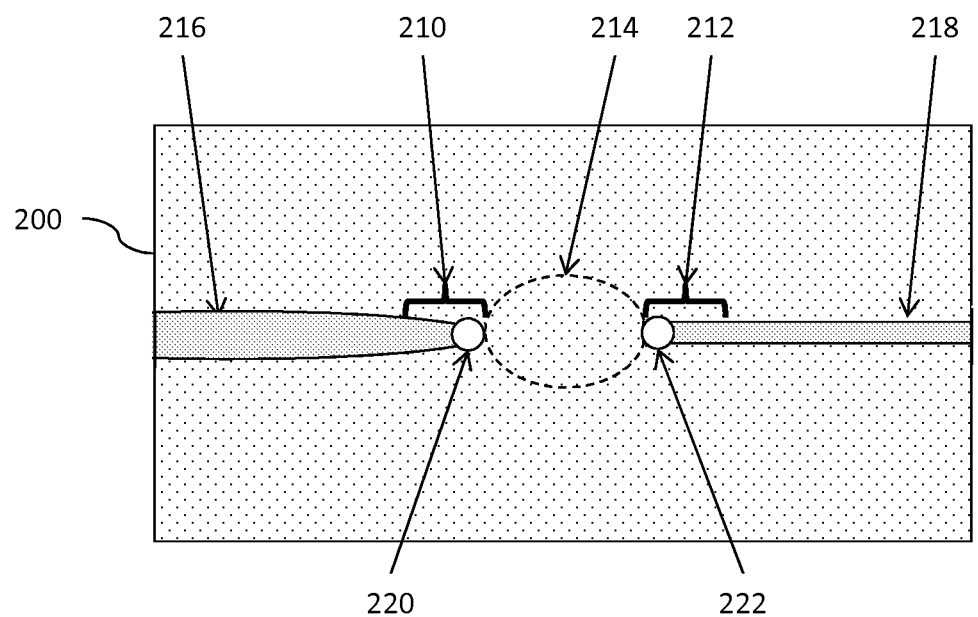
FIG. 6 is a top-view schematic diagram illustrating structures herein.

In light of the inconsistent shapes, sizes, and positions of line ends that can be formed with lithographic patterning processes, these exemplary methods form line end openings 220, 222 as shown in FIGS. 5 and 6. As shown in FIGS. 5 and 6, the line end openings 220, 222 are formed at distal portions of the first line end 210 and the second line end 212 to remove a distal portion of each of the first line end 210 and the second line end 212 (using any of the material removal processes discussed above) and thereby shorten the first line end 210 and the second line end 212. The distal portions of the first line end 210 and the second line end 212 are those portions that directly abut (directly contact) the separation area 214. As noted above, the line end openings 220, 222 formed can all be the same size (e.g., same diameter) and can all be smaller openings than other via openings that are used for conductive vias.

Figure 7:
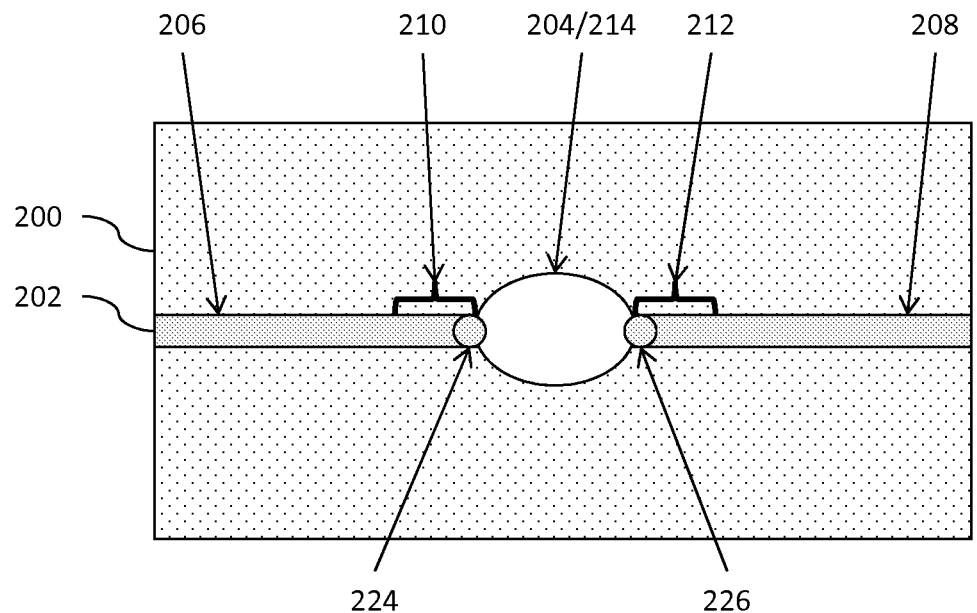
FIG. 7 is a top-view schematic diagram illustrating structures herein.
Figure 8:
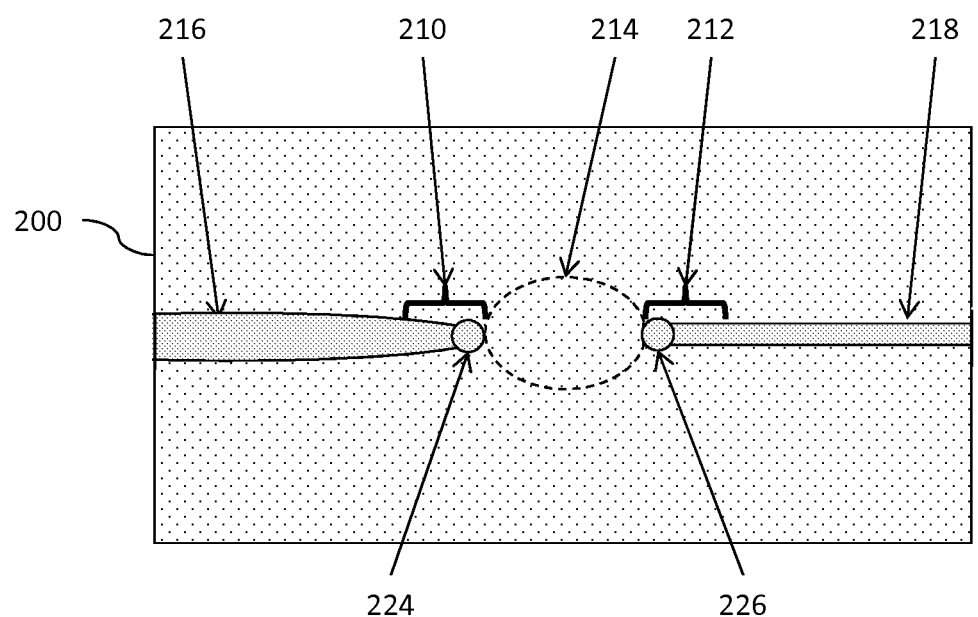
FIG. 8 is a top-view schematic diagram illustrating structures herein.

As shown in FIGS. 7 and 8, these methods fill the line end openings 220, 222 to create filled rounded vias 224, 226. These processes can fill the line end openings 220, 222 with the same (or similar or different) material used to form the linear items (e.g., a conductive material, an insulating material, etc.). Further, the formation and the filling of the line end openings 220, 222 can decrease the surface area of distal ends of the first line end 210 and the second line end 212 (if, for example, the line end openings 220, 222 are filled with a different type of material from the lines 202, 216, 218).

Figure 9:
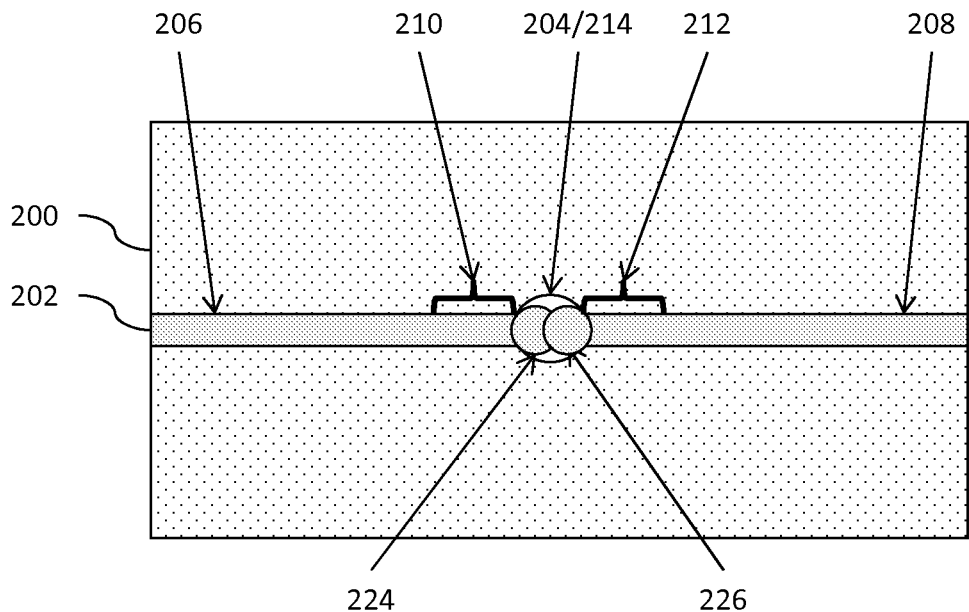
FIG. 9 is a top-view schematic diagram illustrating structures herein.

The process of forming and filling the line end openings with material to form filled rounded vias 224, 226 can be used sometimes to connect the first line end 210 to the second line end 212, as shown in FIG. 9 (if, for example, the size of the separation area 214 permits the size of the filled rounded vias 224, 226 to contact or overlap one another).

Therefore, the processes in FIGS. 5-8 essentially replace the original line ends with filled rounded vias. Round via opening formation techniques are more controllable than processes that pattern lines (or line sections) and, therefore, replacing the line ends with filled rounded vias makes the shape and size of all line ends consistent, thereby increasing the critical dimension uniformity of the first line end 210 and the second line end 212.

Figure 10:
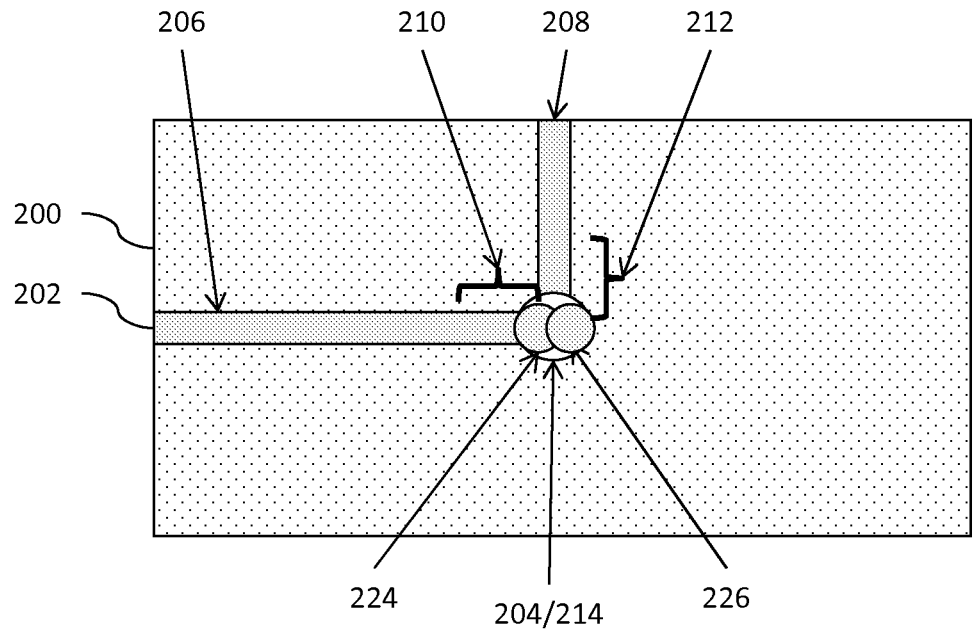
FIG. 10 is a top-view schematic diagram illustrating structures herein.

While the previous examples illustrate that the different linear items 206, 208 (or conductors) are positioned along a single line, with some structures herein, the different linear items 206, 208 can be at an angle other than zero to one another, as shown in FIG. 10.

Figure 11:
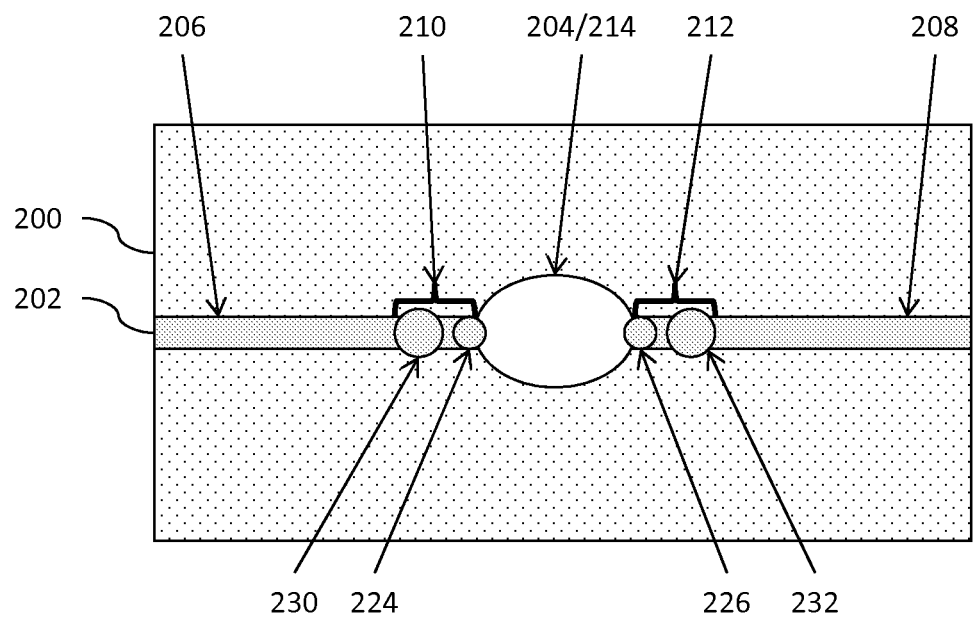
FIG. 11 is a top-view schematic diagram illustrating structures herein.
Figure 12:
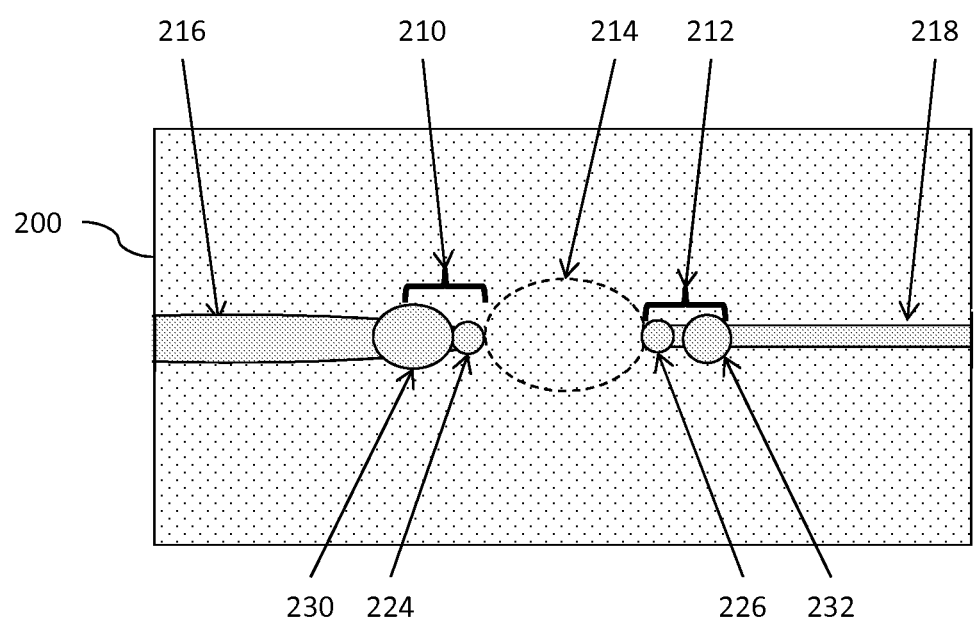
FIG. 12 is a top-view schematic diagram illustrating structures herein.

Additionally, as shown in FIGS. 11 and 12, conductive vias 230, 232 can be formed to be connected to the first line end 210 and/or the second line end 212 at an area immediately adjacent the filled rounded vias through processes of patterning and filling via openings. The conductive vias 230, 232 can be, for example, formed to have a first larger diameter relative to the line end openings 220, 222. Therefore, the filled rounded vias 224, 226 formed from the line end openings 220, 222 can have a second diameter that is smaller than the first diameter of the conductive vias 230, 232.

Indeed, the conductive vias 230, 232 may be formed to have many different diameters; while, to the contrary, in some structures herein the filled rounded vias formed from the line end openings 220, 222 can all be the same size. Thus, the first diameter of the conductive vias 230, 232 can include a plurality of diameter values for different ones of the conductive vias 230, 232; and the second diameter the filled rounded vias 224, 226 formed from the line end openings 220, 222 can include only a single diameter size. In other structures, the filled rounded vias 224, 226 formed from the line end openings 220, 222 can be of different sizes at different line ends.

Figure 13:
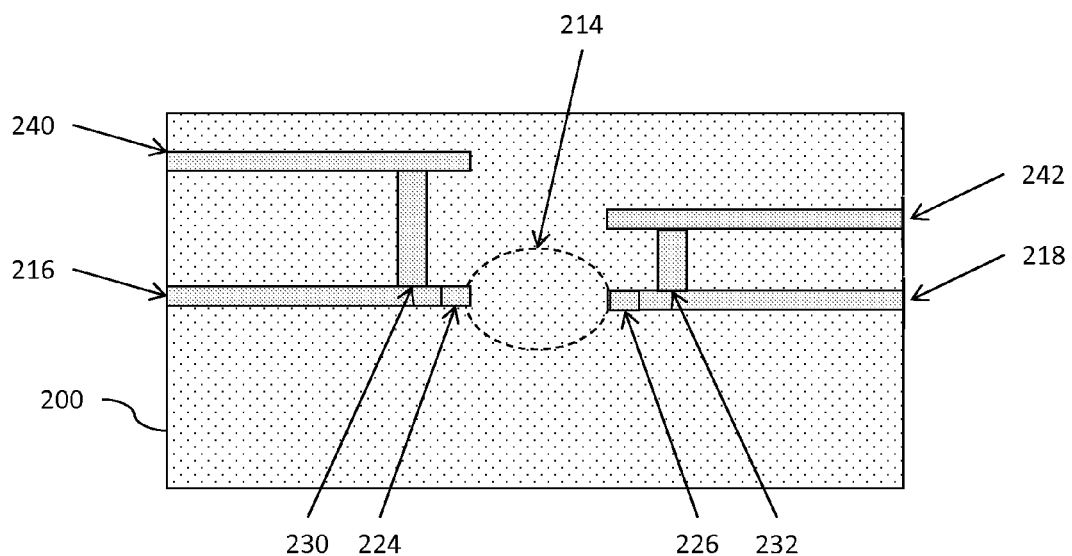
FIG. 13 is a side-view schematic diagram illustrating structures herein.
Figure 14:
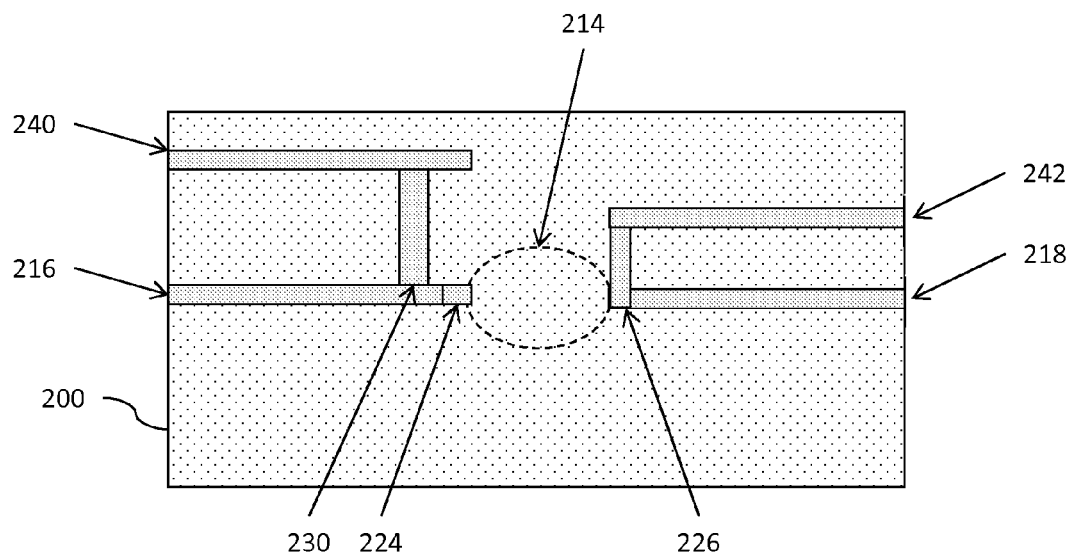
FIG. 14 is a side-view schematic diagram illustrating structures herein.

Additionally, as shown in cross-sectional view in FIG. 13, the filled rounded vias 224, 226 can be fundamentally different from the conductive vias 230, 232 because the filled rounded vias 224, 226 can be formed to only be present within the same plane occupied by the conductive lines 202, 216, 218, in some structures. To the contrary, the conductive vias 230, 232 generally only extend between conductive layers (216 and 240; and 218 and 242) and, therefore, do not occupy the same plane of the conductive lines 202, 216, 218. More specifically, as shown in FIG. 13, the conductive vias 230, 232 can be formed to extend only between different levels of conductors 216 and 240; and 218 and 242 and serve the purpose of electrically connecting the various conductors that exist within different layers of the multi-layer integrated circuit structure. On the other hand, in the structure in FIG. 13, the filled rounded vias 224, 226 make up a part of the conductive line 202, 216, 218 and, therefore can have the same height and width dimensions as the conductive line 202, 216, 218; or at least be positioned only within the same horizontal and vertical plane is that the conductive line 202, 216, 218 his position. In other alternatives, as shown in cross-sectional view in FIG. 14, the filled rounded vias 226 can connect conductive layers (216 and 240; and 218 and 242).

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "contacting", "touching", "on", "in direct contact", "abutting", "directly adjacent to", etc., mean that at least one element physically contacts another element (without other elements separating the described elements).

The terminology used herein is for the purpose of describing particular items only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of these structures have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   providing a layer having a first linear item and a second linear item, said first linear item and said second linear item comprising a material that is different from said layer, a separation area of said layer being between said first linear item and said second linear item, said first linear item having a first line end where said first linear item contacts said separation area, and said second linear item having a second line end where said second linear item contacts said separation area;
   forming line end openings at distal portions of said first line end and said second line end to remove said distal portions of said first line end and said second line end and shorten said first line end and said second line end; and
   filling said line end openings with said material to increase critical dimension uniformity of said distal portions of said first line end and said second line end.

2. The method according to claim 1, said forming line end openings and said filling said line end openings decreasing a surface area of said distal portions of said first line end and said second line end.

3. The method according to claim 1, further comprising forming material-filled vias connected to at least one of said first line end and said second line end,
   said material-filled vias having a first diameter,
   said line end openings having a second diameter smaller than said first diameter.

4. The method according to claim 3, said first diameter comprising a plurality of diameter values for different ones of said material-filled vias,
   said second diameter comprising only a single diameter value, and
   all of said line end openings having the same diameter.

5. The method according to claim 1, said first line end and said second line end having inconsistent shapes, sizes, and positions prior to said forming line end openings and said filling said line end openings.

6. The method according to claim 1, said filling said line end openings with said material connecting said first line end to said second line end.

7. The method according to claim 1, said layer comprising one element in a multi-layer integrated circuit structure.

8. A method comprising:
   providing an insulator;
   patterning a conductive line in said insulator;
   removing a section of said conductive line to divide said conductive line into a first linear conductor and a second linear conductor, a separation area of said insulator being between said first linear conductor and said second linear conductor, said first linear conductor having a first line end where said first linear conductor contacts said separation area, and said second linear conductor having a second line end where said second linear conductor contacts said separation area;
   forming line end openings at distal portions of said first line end and said second line end to remove said distal portions of said first line end and said second line end and shorten said first line end and said second line end; and
   filling said line end openings with a conductive material to increase critical dimension uniformity of said distal portions of said first line end and said second line end.

9. The method according to claim 8, said forming line end openings and said filling said line end openings decreasing a surface area of said distal portions of said first line end and said second line end.

10. The method according to claim 8, further comprising forming conductive vias connected to at least one of said first line end and said second line end,
   said conductive vias having a first diameter,
   said line end openings having a second diameter smaller than said first diameter.

11. The method according to claim 10, said first diameter comprising a plurality of diameter values for different ones of said conductive vias,
   said second diameter comprising only a single diameter value, and
   all of said line end openings having the same diameter.

12. The method according to claim 8, said first line end and said second line end having inconsistent shapes, sizes, and positions prior to said forming line end openings and said filling said line end openings.

13. The method according to claim 8, said filling said line end openings with said conductive material connecting said first line end to said second line end.

14. The method according to claim 8, said insulator comprising one layer in a multi-layer integrated circuit structure.

15. An integrated circuit structure comprising:
   an insulator; and
   a conductive line in said insulator,
   said conductive line comprising a first linear conductor and a second linear conductor separated by a separation area of said insulator,
   said first linear conductor having a first line end where said first linear conductor contacts said separation area,
   said second linear conductor having a second line end where said second linear conductor contacts said separation area,
   said first line end and said second line end comprising line end openings at distal portions of said first line end and said second line end, and
   said line end openings being filled with a conductive material that increases critical dimension uniformity of said distal portions of said first line end and said second line end.

16. The integrated circuit structure according to claim 15, said line end openings filled with said conductive material decreasing a surface area of said distal portions of said first line end and said second line end.

17. The integrated circuit structure according to claim 15, further comprising conductive vias connected to at least one of said first line end and said second line end,
   said conductive vias having a first diameter,
   said line end openings having a second diameter smaller than said first diameter.

18. The integrated circuit structure according to claim 17, said first diameter comprising a plurality of diameter values for different ones of said conductive vias,
   said second diameter comprising only a single diameter value, and
   all of said line end openings having the same diameter.

19. The integrated circuit structure according to claim 15, said first line end and said second line end having inconsistent shapes, sizes, and positions without said line end openings filled with said conductive material.

20. The integrated circuit structure according to claim 15, said line end openings filled with said conductive material connecting said first line end to said second line end.

* * * * *